(12) United States Patent
Schwarz et al.

(10) Patent No.: US 8,410,661 B2
(45) Date of Patent: Apr. 2, 2013

(54) METHOD OF GENERATING ELECTRICAL ENERGY IN AN INTEGRATED CIRCUIT, CORRESPONDING INTEGRATED CIRCUIT AND METHOD OF FABRICATION

(75) Inventors: Christian Schwarz, Rousset (FR);
Christophe Monserie, Les Milles (FR);
Julien Delalleau, Aix en Provence (FR)

(73) Assignees: STMicroelectronics (Rousset) SAS,
Rousset (FR); Universite Aix-Marseille 1 Provence, Marseilles (FR)

( * ) Notice: Subject to any disclaimer, the term of this patent is extended or adjusted under 35 U.S.C. 154(b) by 61 days.

(21) Appl. No.: 12/793,148

(22) Filed: Jun. 3, 2010

(65) Prior Publication Data

US 2010/0308602 A1     Dec. 9, 2010

(30) Foreign Application Priority Data

Jun. 4, 2009   (FR) ...................... 09 53702

(51) Int. Cl.
*H01L 21/02*     (2006.01)
(52) U.S. Cl. ............. 310/319; 310/339; 290/1 R
(58) Field of Classification Search .......... 310/339, 310/319; 290/1 R
See application file for complete search history.

(56) References Cited

U.S. PATENT DOCUMENTS

| | | | | |
|---|---|---|---|---|
| 7,176,601 B2 * | 2/2007 | Tanaka et al. | | 310/339 |
| 2003/0006668 A1 | 1/2003 | Lal et al. | | |
| 2006/0087200 A1 * | 4/2006 | Sakai | | 310/339 |
| 2007/0252479 A1 * | 11/2007 | Ishikawa | | 310/339 |
| 2008/0251856 A1 * | 10/2008 | Zhu et al. | | 257/382 |
| 2008/0251865 A1 * | 10/2008 | Pinkerton | | 257/414 |
| 2008/0277941 A1 * | 11/2008 | Bowles et al. | | 290/54 |

FOREIGN PATENT DOCUMENTS

EP      1317056       6/2003
JP      2003061368    2/2003

* cited by examiner

*Primary Examiner* — Walter Benson
*Assistant Examiner* — Bryan Gordon
(74) *Attorney, Agent, or Firm* — Allen, Dyer, Doppelt, Milbrath & Gilchrist, P.A.

(57) ABSTRACT

A method of generating electrical energy in an integrated circuit that may include setting into motion a (3D) three-dimensional enclosed space in the integrated circuit. The 3D enclosed space may include a piezoelectric element and a free moving object therein. The method may also include producing the electrical energy from impact between the free moving object and the piezoelectric element during the motion.

27 Claims, 17 Drawing Sheets

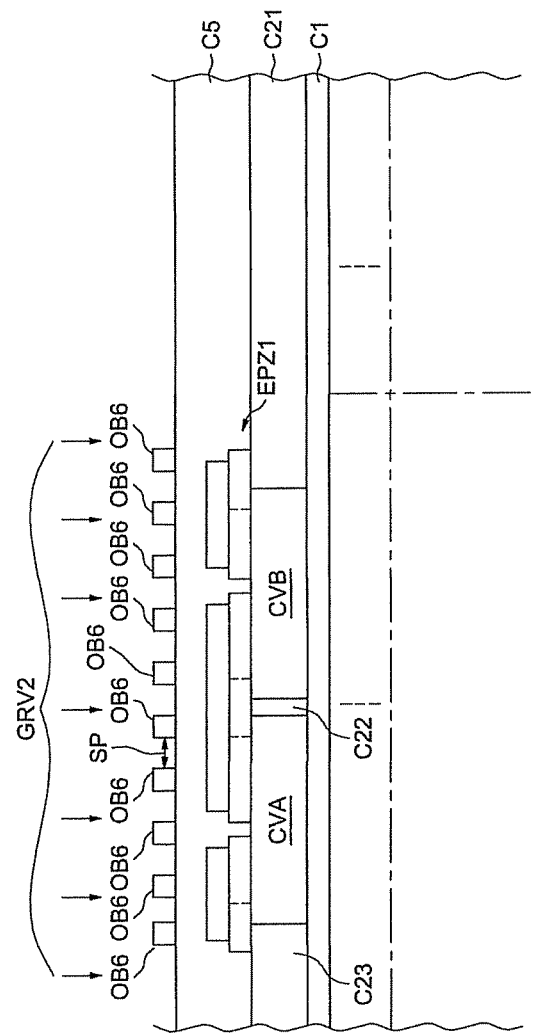

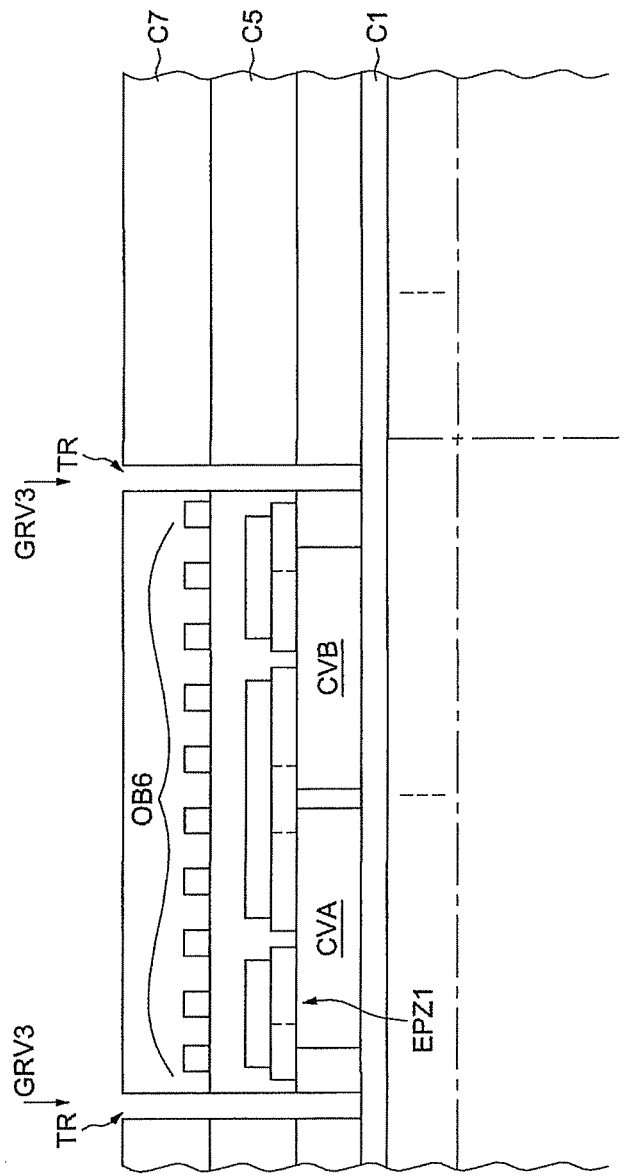

METHOD OF GENERATING ELECTRICAL ENERGY IN AN INTEGRATED CIRCUIT, CORRESPONDING INTEGRATED CIRCUIT AND METHOD OF FABRICATION

FIELD OF THE INVENTION

The present embodiment relates to integrated circuits, and more particularly to the generation of electrical energy in an integrated circuit other than the energy produced by a power supply.

BACKGROUND OF THE INVENTION

Integrated circuits typically comprise a large number of active devices, for example, transistors. Indeed, it is not uncommon for the typical integrated circuit to have several million active devices. As the density of the integrated circuit has increased, the power use of the typical integrated circuit has increased, thereby placing greater demands on limited power sources, for example, batteries in mobile devices.

SUMMARY OF THE INVENTION

According to an embodiment, a method may use erratic motion of three-dimensional objects, for example, of ball-shaped objects, or more generally potatoid-shaped objects, within one or more enclosures, each comprising one or more piezoelectric elements, and may use the impacts of these objects on these piezoelectric elements to produce an electrical pulse, which may be used to power at least one part of the integrated circuit or recharge a micro-battery, or else be stored in a storage means or a storage device, such as a capacitor so as to be reused thereafter. Thus, it becomes possible to prolong, for example, the lifetime of the battery or else optionally to render the device self-powered without it being necessary to equip it with a battery.

According to an embodiment, such a setting into motion of the balls within the enclosures can be performed in various ways. For example, it may be mentioned to use vibrations of acoustic or other origins, or else the movement of the integrated circuit placed on a support, which is itself moving. The invention thus finds numerous applications, for example, in the health sector for power supply and/or for prolonging the lifetime of a battery of a sensor monitoring the heart beat of a human being and placed, for example, in the vicinity of the latter's heart (the movement of the heart causing the balls to be set into erratic motion in the housings). Mention may also be made of sensors for detecting the passage of cars on a bridge, the passage of the car causing the bridge on which the sensor is placed to vibrate and therefore setting the balls into motion in the housing and bringing about the production of an electrical signal that may serve to self-power the sensor or optionally to generate a detection signal. Also, the applications may include the monitoring of the operation of a water pump of a vehicle, which vibrates in operation and which may therefore allow the balls to be set into motion in the housing and cause the generation of electrical energy in the sensor.

According to an embodiment, this is disclosed a method of generating electrical energy in an integrated circuit and an integrated circuit capable of operating with a wide frequency pass band and independently of the direction of the motions of a support on which the integrated circuit is placed.

According to one aspect, there is disclosed a method of generating electrical energy in an integrated circuit. This method ay include a setting into relative motion of at least one three-dimensional enclosed space made within the integrated circuit and having at least one piezoelectric element, and of at least one object housed in a free manner inside each three-dimensional enclosed space. The method may also include a production of electrical energy resulting from at least one impact between the object and the piezoelectric element during the relative motion.

The expression three-dimensional enclosed space may be understood to imply any device, for example a box or a cage, having an aperture or otherwise, making it possible to prevent the objects, generally three-dimensional, from exiting the enclosed space during their motions. Moreover, an object housed free in such an enclosed space has the ability to move freely in any direction in space, generally in an erratic manner, having regard optionally to the impacts on the various walls of the housing, when the enclosed space and the object are set into relative motion.

The use of a three-dimensional space in combination with objects, generally three-dimensional, for example, in the form of potatoids, allows operation which is not limited to a particular direction in which the motion is set going and which therefore adapts to any type of motions to which the integrated circuit would be subjected. Moreover, the use of these objects that can move in an erratic manner in the enclosed space so as to strike the piezoelectric element or elements is totally independent of any frequency of motion and/or frequency of operation of the piezoelectric element, thereby making it possible to offer a method capable of producing energy in an integrated circuit whose frequencies, if any, of motions can be very varied.

Of course, the size of the objects and/or their number as well as the volume of the enclosed space and/or their number may be adapted as a function of the applications. Thus, it is possible to house several objects in a free manner in the enclosed space or in at least one of the enclosed spaces, and the energy production then results from each impact of at least one object on at least one piezoelectric element inside the enclosed space.

It is also possible for at least one enclosed space to contain several piezoelectric elements and the electrical energy production to result from each impact of at least one object on at least one piezoelectric element inside the enclosed. In fact, for an enclosed space, the quantity of energy produced may depend on the number of impacts, and consequently on the number of objects and/or on the number of piezoelectric elements in this enclosed space. The person skilled in the art may know how to adjust these parameters as a function of the envisioned application.

Of course, so that the objects can move freely in the enclosed space, it is necessary for the sum of their volume to be less than the free volume available in the enclosed space. That said, it is preferable to have a volume sum of the objects that is much less than the free volume so as to be able to give more freedom of motion to the objects and therefore allow them to more easily strike the piezoelectric element or elements.

Here again, the person skilled in the art may know how to adjust these parameters as a function of the envisioned application. That said, by way of indication, the sum of the volume of the objects in an enclosed space can be, for example, greater than a tenth of the free interior volume of the enclosed space and less than a quarter of this free interior volume. Likewise, the size of the objects inside one and the same enclosed space can be identical or different. The fact of using different sizes makes it possible to further increase the pass band of the device and can thus avoid, for example, having a Gaussian distribution centered on a single frequency. The size of the objects can also be different from one enclosed space to another. Likewise, the size and/or the shape of the piezoelectric elements can be identical or different from one enclosed space to another or within one and the same enclosed space.

According to an embodiment, at least one piezoelectric element is fixed in the vicinity of at least one part of a wall of the enclosed space or of at least one of the enclosed spaces in such a way that the object is housed in a free manner between the piezoelectric element and the other walls of the enclosed space.

According to another embodiment, it is also possible to fix at least one first piezoelectric element in the vicinity of at least one part of a first wall, for example, a lower wall, of the enclosed space or of at least one of the enclosed spaces and to fix at least one second piezoelectric element in the vicinity of at least one part of a second wall of this enclosed space, for example, an upper wall, in such a way that the objects are housed in a free manner between the first piezoelectric element, the second piezoelectric element or elements, and the other walls of the enclosed space, for example, the lateral wall. Such a configuration makes it possible to further increase the number of possible impacts and therefore to increase the quantity of electrical energy produced.

As a variant, at least one of the walls itself of the enclosed space could be formed of a piezoelectric material provided that the thickness of the wall as well as the size and the weight of the objects allow deformation of this material during an impact of the object on this wall. Of course, the surfaces of the piezoelectric element or elements and/or of the wall or walls optionally forming a piezoelectric element can be of any form (plane, rough, undulated, slanted, etc.).

The enclosed space is advantageously made above a metallization level of the integrated circuit, that is to say in the part of the integrated circuit comprising the metallic interconnections and commonly designated by the person skilled in the art by the name "back-end-of-line" (BEOL). It is, for example, possible to use continuously the energy produced by the impacts of the objects on the piezoelectric elements so as, for example, to recharge a battery powering the integrated circuit. That said, it is also possible to store the electrical energy produced in a storage means or a storage device made in the integrated circuit, for example, a capacitor, which may be able thereafter to be discharged entirely or in part so as to power all or part of the active elements of the integrated circuit.

The setting into relative motion of the housing or housings and of the object or objects can result from the occurrence of an event external to the integrated circuit interacting directly or at a distance with the integrated circuit. A direct interaction occurs, for example, when the integrated circuit is placed on a support that is intended to move.

An interaction at a distance can, for example, result from an acoustic wave caused by the occurrence of an event, this acoustic wave, when it is received at the level of the housing, causing the setting into relative motion of the enclosed space (or housing) and of the objects. An exemplary application is the detection of break-ins. For example, if a sensor integrating the integrated circuit is placed on an opening, for example, a bay window, the fracturing of the bay window may give rise to vibrations which may set the balls and the housing into relative motion and consequently generate electrical production which may be able, for example, to be used to emit a detection signal.

Thus, according to another aspect, there is proposed a method for detecting the occurrence of an event external to the integrated circuit, comprising a method of generating energy in the integrated circuit such as defined above. The setting into relative motion is caused by an action resulting from the occurrence, and the detection method comprises the emission of a signal generated on the basis of the energy production.

According to another aspect, there is an integrated circuit comprising at least one three-dimensional enclosed space made within the integrated circuit and containing at least one piezoelectric element, at least one object housed in a free manner in the three-dimensional enclosed space, and electrically conducting output means or an electrically conductive output coupled to the piezoelectric element. The output configured to deliver electrical energy resulting from at least one impact between the piezoelectric element during a relative motion of the object and of the corresponding enclosed space.

According to one embodiment, several objects are housed in a free manner in the enclosed. According to one embodiment, the enclosed space contains several piezoelectric elements. According to another embodiment, at least one piezoelectric element is fixed in the vicinity of at least one part of a first wall of the enclosed space in such a way that the object is housed in a free manner between the piezoelectric element and the other walls of the enclosed space.

According to another embodiment, at least one first piezoelectric element is fixed in the vicinity of at least one part of a first wall of the enclosed space and at least one second piezoelectric element is fixed in the vicinity of at least one part of a second wall of the enclosed space in such a way that the object is housed in a free manner between the first piezoelectric element, the second piezoelectric element and the other walls of the enclosed space. At least one piezoelectric element can comprise at least one beam mounted in cantilever fashion and formed of at least one piezoelectric material.

As a variant, at least one piezoelectric element can comprise a monoblock assembly comprising several beams, each beam being mounted in cantilever fashion and formed of at least one piezoelectric material. According to one embodiment, the beam mounted in cantilever fashion is mounted at a distance from the first wall so as to form an aperture having piezoelectric mat disposed facing the first wall, the aperture spaces of the mat having a smaller size than the size of each object. By way of indication, in the case where the objects are substantially ball-shaped, it is possible to provide aperture having spaces with a size of the order of half the diameter of the balls.

According to another embodiment, at least one piezoelectric element comprises an aperture having plate fixed by its edges in at least one enclosed space so as to be able to deform in a direction orthogonal to its surface, the plate being formed of at least one piezoelectric material. The aperture having spaces of the plate having a smaller size than the size of each object. The beam mat and the aperture plate can thus be advantageously disposed facing one another, the object or objects being housed in a free manner between the mat and the plate. The size of each object can be an at most of the micrometer size, or indeed a nanometer size.

The enclosed space or spaces can advantageously be disposed above a metallization level of the integrated circuit, that is to say in the "back-end-of-line" part of the integrated circuit. The integrated circuit can furthermore comprise a storage means or a storage device coupled to the electrically conductive output and configured to store the energy produced.

According to another aspect, there is a device for detecting the occurrence of an event, this detection device comprising an integrated circuit such as defined above, designed to receive an incident signal, for example, a vibration, resulting from the occurrence and capable of causing the setting into relative motion, and emission means or an emitter configured to deliver an output signal generated on the basis of the energy delivered by the output of the integrated circuit. Thus, such a sensor can optionally be completely devoid of electrical power supply and it is the occurrence of the event that may cause the housing and the balls to be set into relative motion and may deliver the energy used for the emission of a detection signal, for example, infrared or radio frequency.

According to another aspect, there is a method of fabricating an integrated circuit comprising a making of an active part of the integrated circuit, commonly designated by the person skilled in the art by the name "front-end-of-line" (FEOL), and a making of an interconnection part above the active part, commonly designated by the person skilled in the art by the name "back-end-of-line" (BEOL). According to a general characteristic of this aspect, the method of fabrication furthermore comprises, during the making of the interconnection part, a making of at least one three-dimensional enclosed space, a making of at least one first piezoelectric element in the enclosed space, and a making of at least one object housed in a free manner in an enclosed space.

According to one embodiment, a lower layer, for example, a metallization level, forming a lower wall of the corresponding enclosed space is made to support the first piezoelectric element. According to one embodiment, the making of the first piezoelectric element comprises a formation on the lower layer, of a stack comprising a support layer, for example, a layer of a dielectric material, and a layer of a piezoelectric material, an etching of the piezoelectric material layer so as to form a mat of beams, and a partial etching of the support layer so as to make the mat of beams mounted in cantilever fashion. The making of the first piezoelectric element can furthermore comprise a formation of a network of metallized tracks on the piezoelectric material layer. This formation can be performed preferably before the etching of the piezoelectric material layer, so as to avoid the deposition of metal in the cavities situated under the beams mounted in cantilever fashion.

According to one embodiment, the making of the object comprises a formation on the piezoelectric element of an intermediate layer, for example, a dielectric layer, a formation of an extra layer, for example, of an aluminum layer or of any other relatively heavy material, such as tantalum, on the intermediate layer, an etching of the extra layer so as to partially form the object, the latter still resting on the intermediate layer, and a formation on an additional layer, for example, a layer of dielectric, on the etched layer. The making may also include a formation of a lateral trench surrounding the first piezoelectric element, the intermediate layer, the etched layer and the additional layer, a filling of the trench, for example, with tungsten, a formation on the additional layer and on the trench, of an upper layer, for example, of silicon nitride, an etching of the upper layer so as to form openings whose size is smaller than the size of the objects, and a selective etching, through the openings, of the intermediate layer and of the additional layer, thereby making it possible to completely free the objects, the latter then falling to the bottom of the housing (enclosed space).

The making of the enclosed space can furthermore comprise a formation of a final layer on the apertured upper layer, for example, a layer of dielectric intended to support another upper metallization level of the integrated circuit. The method of fabrication can furthermore comprise a making of at least one second piezoelectric element facing the first piezoelectric element.

In such an eventuality, the apertured upper layer, through which may be carried out the etching of the layers so as to completely free the objects, can be a piezoelectric layer which may form the second piezoelectric element. The formation of this second piezoelectric element can then comprise a formation of an auxiliary layer, for example, a silicon nitride layer, on the apertured piezoelectric layer, a partial etching of the auxiliary layer so as to form a cavity above a part of the piezoelectric layer and a part for bracing the piezoelectric layer around the cavity, and a formation on the bracing part of a final covering layer also covering the cavity.

BRIEF DESCRIPTION OF THE DRAWINGS

Other advantages and characteristics of the disclosed embodiments may be apparent on examining the detailed description of wholly non-limiting modes of implementation and embodiment, and the appended drawings in which:

FIGS. 3 to 18 are schematic diagrams of the steps pf fabrication of an integrated circuit, according to the present embodiment;

DETAILED DESCRIPTION OF THE PREFERRED EMBODIMENTS

Figure 1:
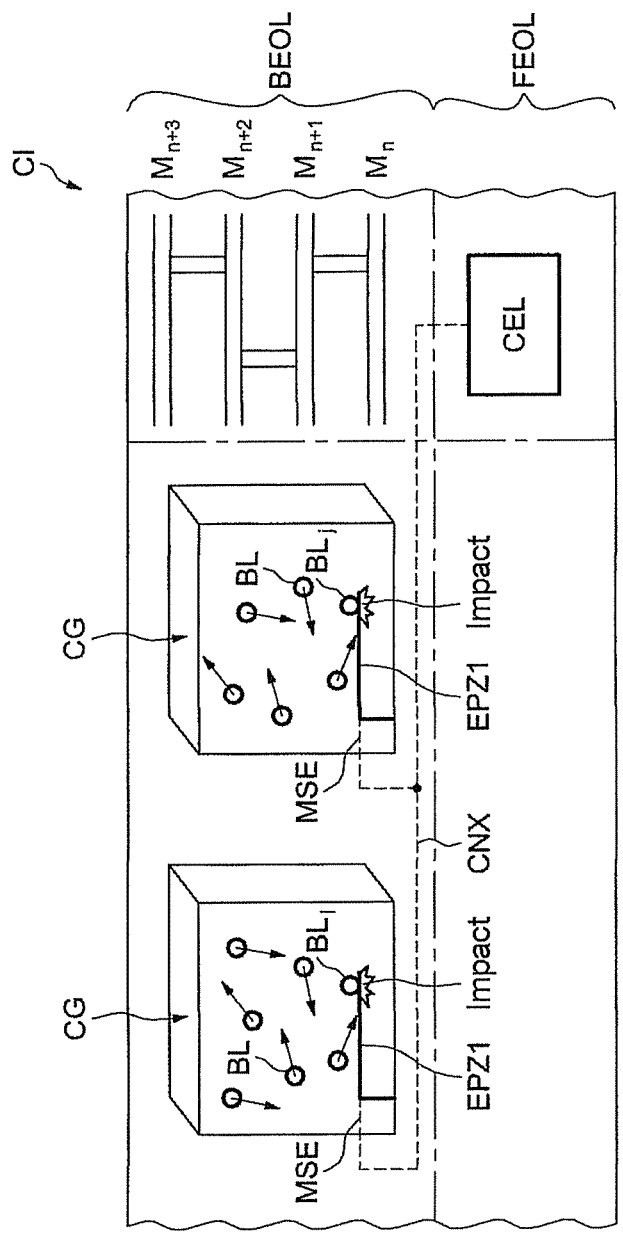
FIG. 1 is a schematic diagram of an embodiment of an integrated circuit, according to the present embodiment.

In FIG. 1, the reference CI designates an integrated circuit comprising a part FEOL, commonly designated by the person skilled in the art by the expression "front-end-of-line," and a second part BEOL mounted on top, commonly designated by the person skilled in the art by the expression "back-end-of-line." The part FEOL is in fact the first fabricated part of the integrated circuit in which are situated the individual active components, such as, for example, transistors, resistors. The part FEOL generally encompasses all the various elements of the integrated circuit as far as the first metal layer.

The upper part of the integrated circuit, namely the part BEOL, is that part of the integrated circuit in which the active components (transistors, resistors, etc) are interconnected by way of metallization levels $M_n$, $M_{n+1}$, . . . and vias. This part BEOL begins with the first metallization level and it also includes the vias, the insulating layers as well as the contact pads disposed on the upper part of the integrated circuit.

As illustrated in FIG. 1, the integrated circuit CI incorporates, in the part BEOL, at least one three-dimensional enclosed space CG, and in general several three-dimensional enclosed spaces. In FIG. 1, only two three-dimensional enclosed spaces are represented for the sake of simplification. Each three-dimensional enclosed space in fact forms a cage or an enclosed housing CG each incorporating at least one object BL, for example, ball-shaped and more generally potatoid-shaped. The objects BL, contained in each cage CG, are capable of moving freely therein.

Moreover, each enclosed housing CG is equipped with at least one piezoelectric element EPZ1. Thus, as may be seen in greater detail hereinafter, when a cage CG and the objects which are contained therein are set into relative motion, at least some of these objects may during their erratic motions come into contact with the piezoelectric element EPZ1 as is the case for example for the object $BL_i$ or the object $BL_j$. Such an impact may then cause a deformation of the piezoelectric element and cause the delivery of electrical energy.

This electrical energy is delivered by way of electrical output MSE coupled to each piezoelectric element EPZ1. This may be seen again in greater detail hereinafter in an exemplary embodiment of the electrical output MSE. These electrical outputs MSE are moreover linked to a specific circuit CEL by an electrical connection CNX. As may be seen in greater detail hereinafter, this specific circuit CEL is for example capable of storing the energy produced by the successive impacts of the balls on the piezoelectric elements.

Figure 2:
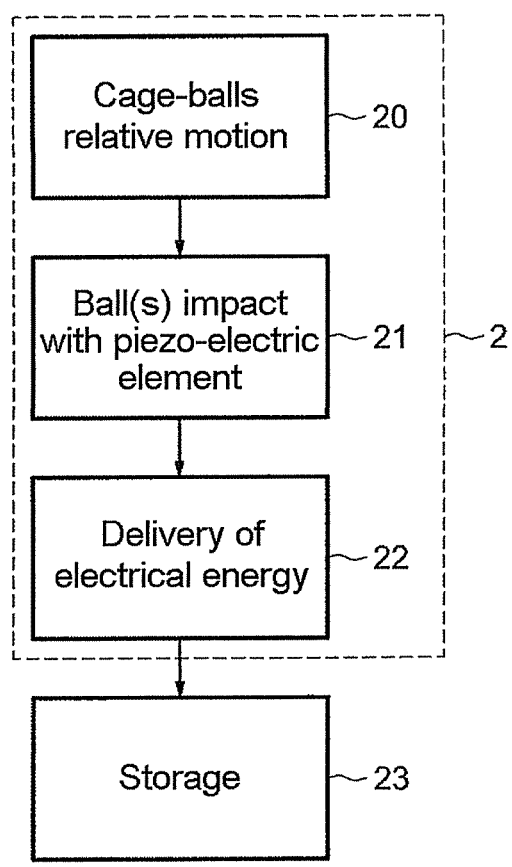
FIG. 2 is a flowchart illustrating an exemplary implementation of a method, according to the present embodiment.

Although the elements of this specific circuit CEL could be made between metallization levels, in particular when capacitors are involved, they are in practice made in the part FEOL of the integrated circuit, but not necessarily under the cages CG, as illustrated by the example in FIG. 1. The main steps of a method of generating electrical energy in an integrated circuit such as that illustrated in FIG. 1 have been illustrated in a schematic manner in FIG. 2.

As indicated above, the cage-balls relative motion 20 (caused for example by the setting of the integrated circuit itself into motion, or else, as may be seen in greater detail hereinafter, by the receiving of vibrations) may induce an erratic displacement of the balls in the cage, causing directly or indirectly by ricochets off the walls of the cage, one, and in general several impacts of one, or indeed of several balls with the piezoelectric element (step 21). Each impact of a ball with the piezoelectric element may cause its deformation and consequently the delivery of an electrical energy pulse (step 22).

This electrical energy can be used to recharge for example a micro-battery disposed in the integrated circuit, or else to power a very specific part of the integrated circuit that therefore need no longer be powered by the battery itself of the integrated circuit. The energy delivered can also be stored (step 23) in the specific storage circuit CEL so as to subsequently be returned.

The use of three-dimensional objects, for example in the form of balls, and more generally of potatoids, capable of moving freely in a three-dimensional enclosed space so as to come into contact with a piezoelectric element, offers great flexibility of use as regards the direction of the displacement motions of the integrated circuit. In fact, this relative motion is capable of being engaged whatever the type of motion and the direction of the motion to which the integrated circuit may optionally be subjected.

Likewise, this three-dimensional aspect of the housing in combination with the balls makes it possible to de-correlate the operation of the energy production device from any specific frequency of displacement and/or of resonance of the piezoelectric element. The integrated circuit consequently exhibits a wide operating pass band.

Of course, the size of the objects as well as their weight may have to be adapted as a function of the internal volume of the enclosed space and of the mechanical characteristics of the piezoelectric element, so as to be able to offer the possibility of a sufficient erratic motion of the objects in the volume in order to obtain a sufficient number of impacts without running the risk of destroying the piezoelectric element.

Likewise, the size of the objects in each enclosed space CG, although generally identical for the sake of simplification of fabrication, can be different from one object to another and/or from one cage to another. Likewise, the piezoelectric elements can exhibit different geometric configurations and/ or forms from one cage to another, or indeed within one and the same cage, when a cage comprises several piezoelectric elements. In practice, the size of the potatoids is of the order of micrometers or indeed nanometers.

Exemplary embodiments of integrated circuits according to the invention may now be described in greater detail, while referring to FIGS. 3 to 18. In these figures, for the sake of simplification, the making of a single cage (enclosed space) equipped with piezoelectric elements and incorporating objects, such as micro-balls, may be represented, it being understood of course that, in the case where the integrated circuit incorporates several cages, the latter are made simultaneously.

Figure 3:
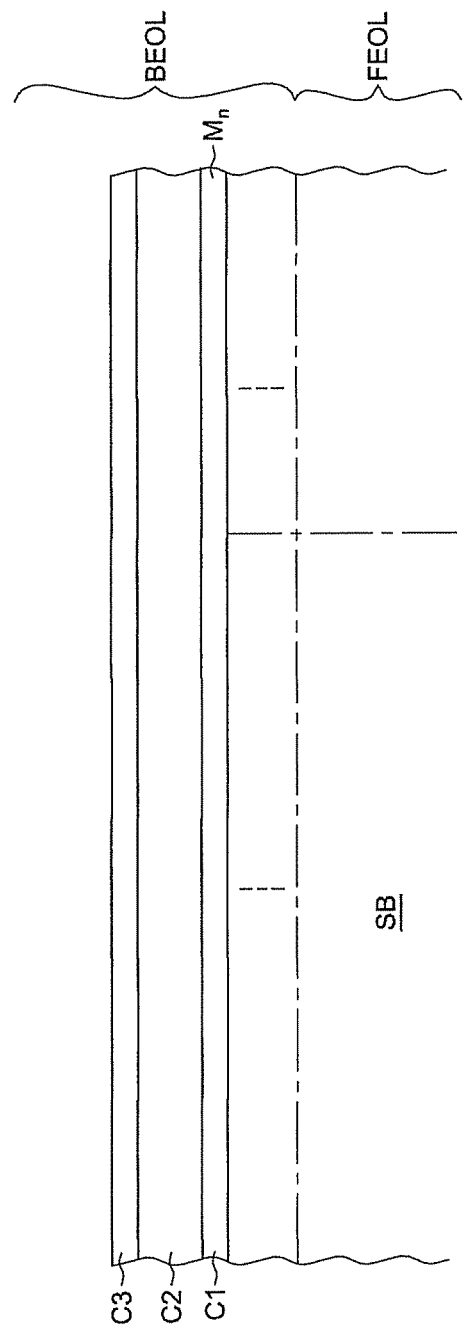
Figure 4:
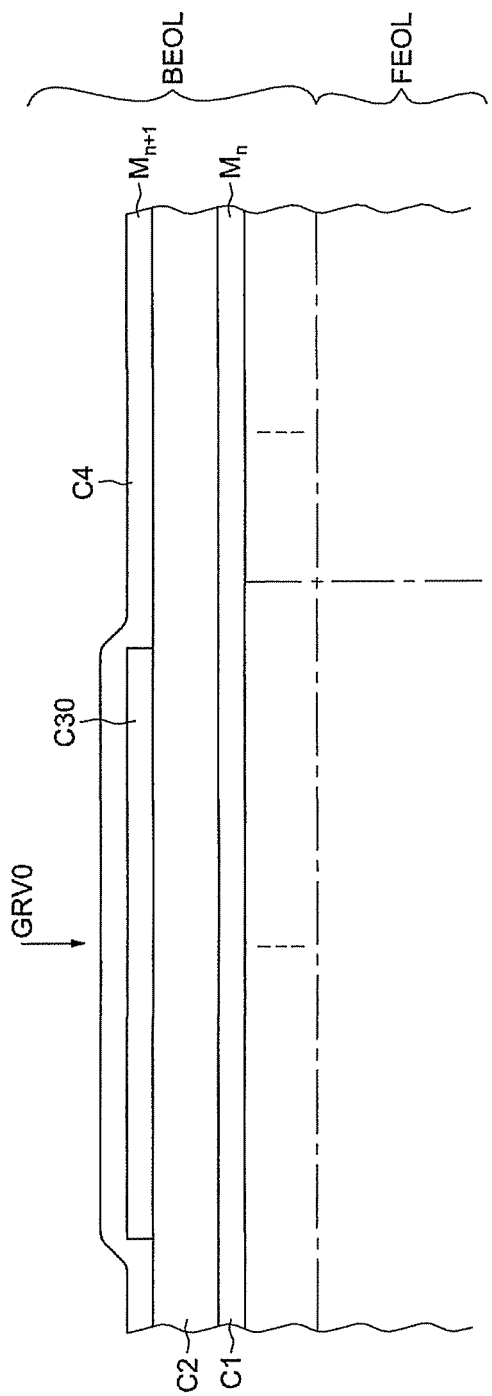

In FIG. 3, it is assumed that the making of the cage CG, of the piezoelectric element and of the objects starts with the deposition of a lower layer C1 corresponding here to the level of metal/$M_n$. This layer C1, for example copper or aluminum, has for example a thickness of the order of 4000 Angstroms. This layer C1 is thereafter covered by a layer C2, forming as may be seen in greater detail hereinafter a support layer, and comprising for example of a dielectric material such as silicon dioxide or else an inter-level dielectric. This layer C2 is formed in a conventional manner by a chemical vapor deposition, for example, (CVD) and its thickness can vary for example from a few hundred to a few thousand angstroms.

A layer C3 formed of a piezoelectric material is thereafter formed, for example, by deposition, on the support layer C2. Here again the thickness of this layer can vary from a few hundred to a few thousand angstroms according to the technology used. Numerous piezoelectric materials can be used such as for example quartz, tantalum, tantalum nitride, or else a material from the family of the PZTs (Lead Titano-Zirconate) of chemical formula $Pb(Zr_x, Ti_{1-x})O_3$. For example, a liquid phase deposition may be used for a material of the PZT type or else a conventional deposition of CVD type may be used for tantalum or tantalum nitride.

Figure 5:
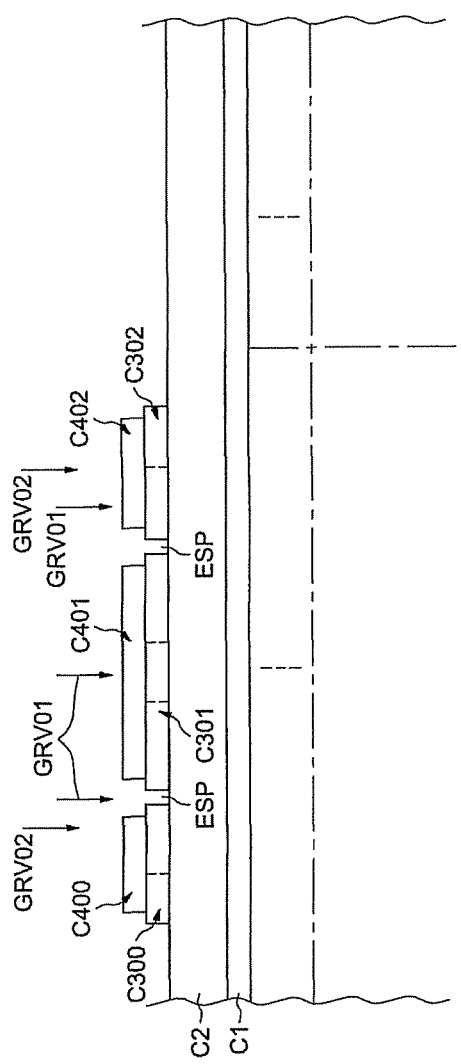
Figure 6:
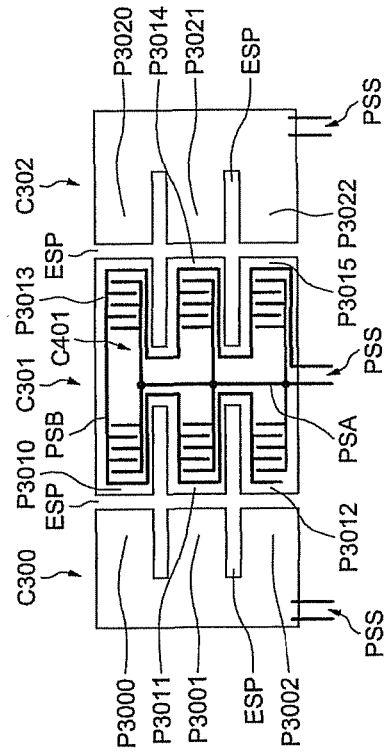

After having etched by a conventional anisotropic etching GRV0 the piezoelectric layer C3 (FIG. 4), so as to obtain a piezoelectric layer portion C30 in which the various piezoelectric elements may be made, the assembly is covered by an electrically conducting layer C4, for example by the metallic layer of the following metallization level This metallic layer C4 may allow the making, as may be seen in greater detail now in FIGS. 5 and 6, of interleaved metal tracks making it possible to conduct the electrical energy resulting from the deformation of the piezoelectric material during the impacts with the objects.

It is seen in FIG. 5 and in FIG. 6, which is a view from above of FIG. 5, that the final pattern sought for the layer C30 is formed of three monoblock assemblies C300, C301 and C302 each forming several beams. Thus, the assembly C300 comprises three beams P3000, P3001 and P3002 spaced apart by spaces ESP. The assembly C301 comprises two symmetric groups of three beams P3010, P3011, P3012 and P3013, P3014 and P3015. The beams of each group are also spaced apart by spaces ESP.

The assembly C302 also comprises a group of three beams P3020, P3021 and P3022 also mutually spaced apart by spaces ESP. Moreover, the assemblies C300, C301 and C302 are themselves mutually spaced apart with a space ESP. In this figure, the spaces have been referenced by the same reference ESP. They may in practice be equal or else different.

Two metal tracks PSA and PSB extending over the assembly of the beams are made by masking and then by etching GRV01 of the metallic layer C4. More particularly, as seen on the assembly C301, these two metal tracks form, on the upper surface of each of the beams, two combs whose teeth interlock. Moreover, the part of these two tracks PSA and PSB which leaves each assembly C300, C301, C302 is referenced PSS and here forms an exemplary embodiment of the electrical outputs MSE (FIG. 1) making it possible to remove the electrical energy generated by the piezoelectric element.

These two metal tracks PSS may be extended by tracks of the metallization level $M_{n+1}$ so as to join up at another place in the integrated circuit, by way of vias and optionally other metallization levels, with the specific circuit CEL disposed in the part FEOL of the integrated circuit. These other tracks and vias, if any, form an exemplary embodiment of the electrical connection CNX (FIG. 1) between the output PSS and the specific circuit CEL. For the sake of simplification, the serpentine of the metal tracks PSA and PSB on the assemblies C300 and C302 has not been represented, but simply their output PSS has been represented.

Figure 7:
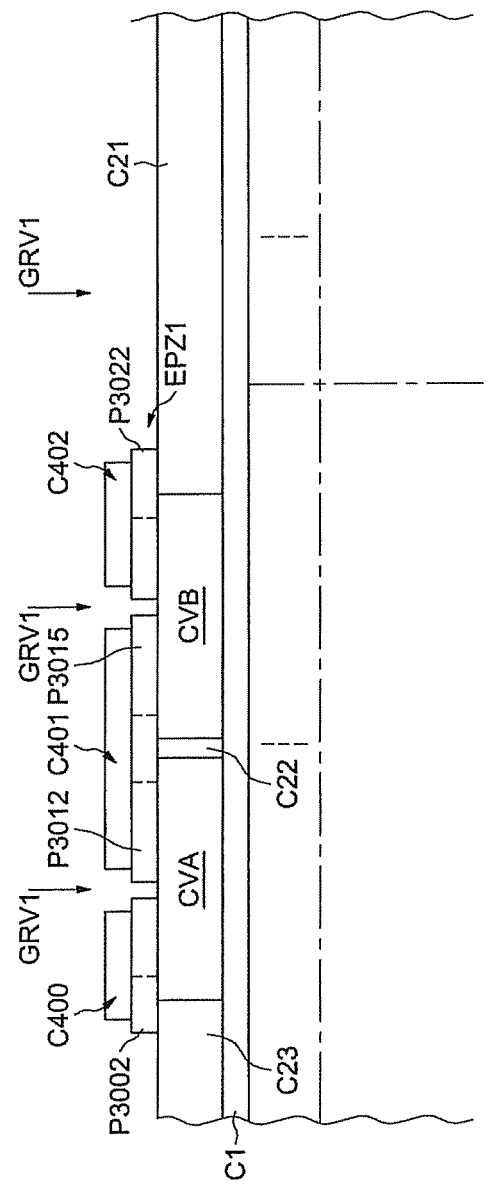

Once these metal tracks have been etched, a conventional etching GRV02 of the layer C30 is carried out after masking so as to form the assemblies C300, C301 and C302. Next, as illustrated in FIG. 7, another etching GRV1 of the layer C2 is carried out through the spaces ESP so as to create cavities CVA and CVB under the assemblies C300, C301 and C302. The etching GRV1 is first of all anisotropic and then isotropic so as to create the cavities.

On completion of this etching operation, the various beams of the various assemblies are mounted in cantilever fashion, that is to say they overhang the residual supports C23, C22 and C21 of the layer C2. Thus in this example, three piezoelectric elements which are designated globally by the reference EPZ1 have been made. The first piezoelectric element is formed of the three cantilever beams P3000, P3001 and P3002. The second piezoelectric element is formed of the two symmetric groups of cantilever beams P3010, P3011, P3012 and P3013, P3014 and P3015.

The third piezoelectric element is formed of the three cantilever beams P3020, P3021 and P3022, all these beams being covered with the metallizations C400, C401 and C402 forming the tracks PSA and PSB. The etching of the beams could be performed before the etching of the metal tracks. That said it is preferable to do the converse as described above so as to avoid the risk of depositing metal between the beams.

Figure 8:
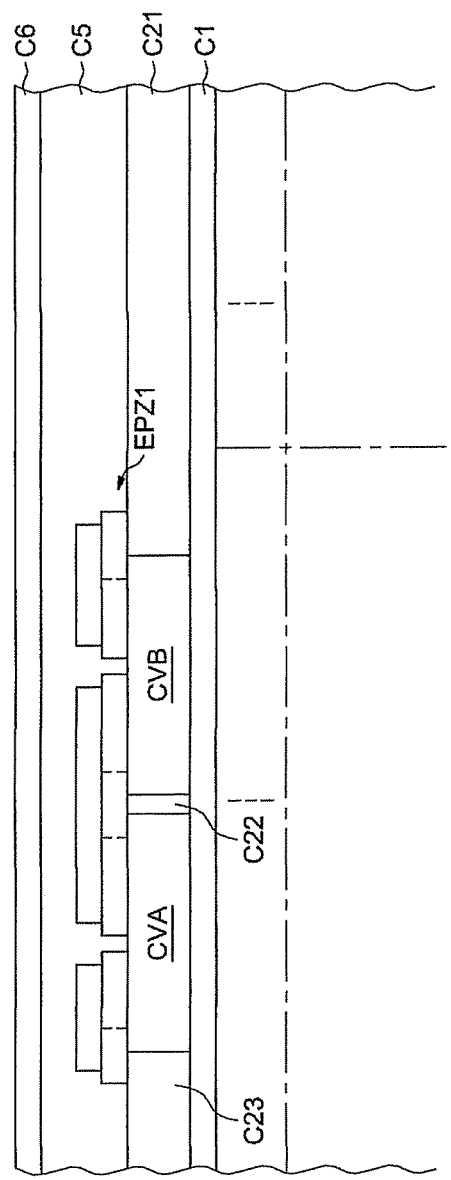

An intermediate layer C5, for example of the same composition as that of the layer C2 and consequently of that of the remnants C21 and C23, is thereafter formed on the piezoelectric elements EPZ1 and on the remnants of layer C21 and C23 (FIG. 8). Next, an extra layer C6 in which the objects intended to move freely in the cage may be made is formed, for example by deposition, on the intermediate layer. This layer C6 can be formed for example of aluminum, of tantalum, of silicon nitride, or else of a material of the PZT family or of any other sufficiently heavy material. The thickness of this layer C56 may determine one of the dimensions of each object. This dimension varies according to the technology used. It may by way of indication be between a few hundred angstroms and about a micron.

After having masked the layer C6 so as to delimit the objects, the etching GRV2 of this layer C6 is carried out (FIG. 9) so as to obtain a multitude of objects OB6. Although the front face of each object has been represented for the sake of simplification in the shape of a square in FIG. 9, the real shape of an object is more a potatoid shape resulting from the etching operations, as is illustrated in FIG. 10. At this juncture, each object OB6 rests on the upper surface of the layer C5. The space SP between each object is taken for example equal to the size of each object, i.e. of the order of a micron for example.

Figure 12:
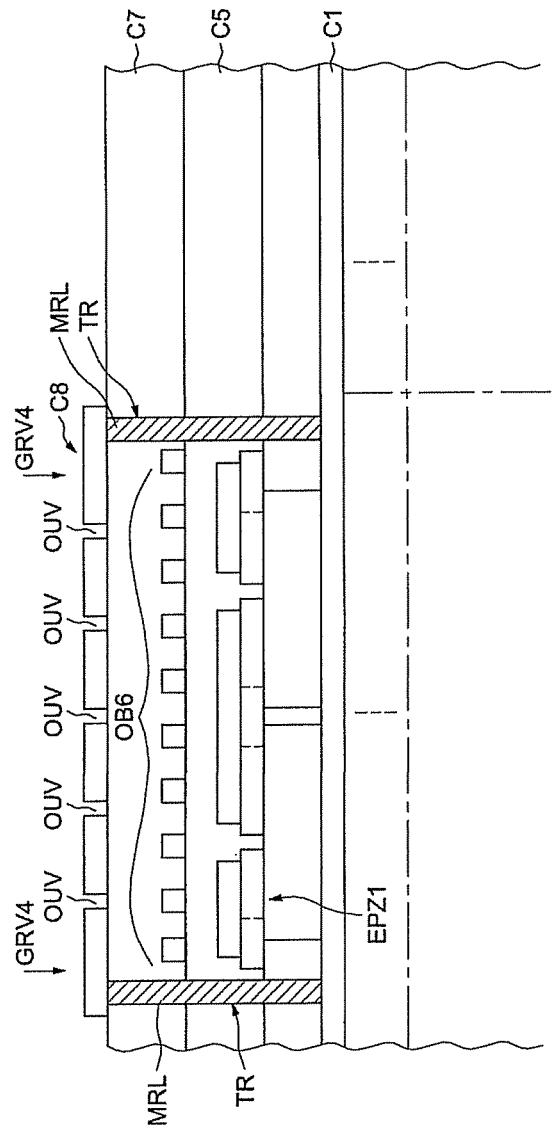
Figure 13:
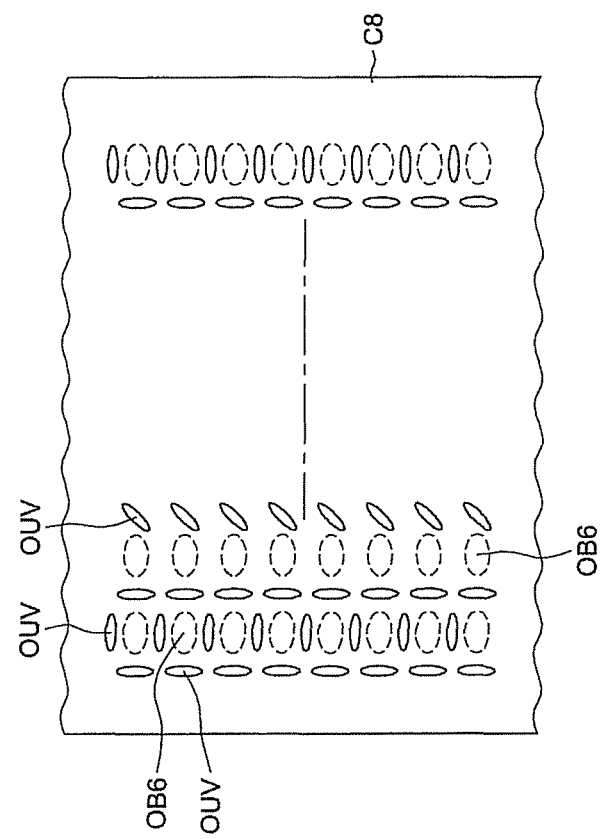

In the following step (FIG. 11), the objects OB6 and the layer C5 are covered with an additional layer C7, for example also of the same composition as the layer C5. Next, an etching of the assembly is carried out on either side of the piezoelectric elements EPZ1 so as to define a lateral trench TR. This etching GRV3 is a conventional anisotropic etching that may stop on the lower layer C1. Next, as illustrated in FIG. 12, the filling of this lateral slice TR with a filling material MRL, for example tungsten, is carried out.

It is therefore seen here that the cage CG that may subsequently be formed is delimited in its lower part by the lower layer C1 and on its sides by the lateral trench TR. It should be noted here that the trench TR may be in one or more pieces as a function of the requirements of the outputs of the signals and/or of the sizes of the cages.

After a conventional planarization step, an upper layer C8 is formed, for example by a deposition of conventional CVD type, on the layer C7 and on the filled trenches TR. Next, as illustrated in FIG. 12 and in FIG. 13 which represents a view from above of FIG. 12, a conventional anisotropic etching GRV4 of the layer C8 is carried out so as, on the one hand, to delimit it and, on the other hand, to make openings OUV in this layer C8. The openings OUV are preferably disposed vertically in line with the perimeter of each object OB6. The thickness of the layer C8 is of the order of a few thousand angstroms for example.

Figure 14:
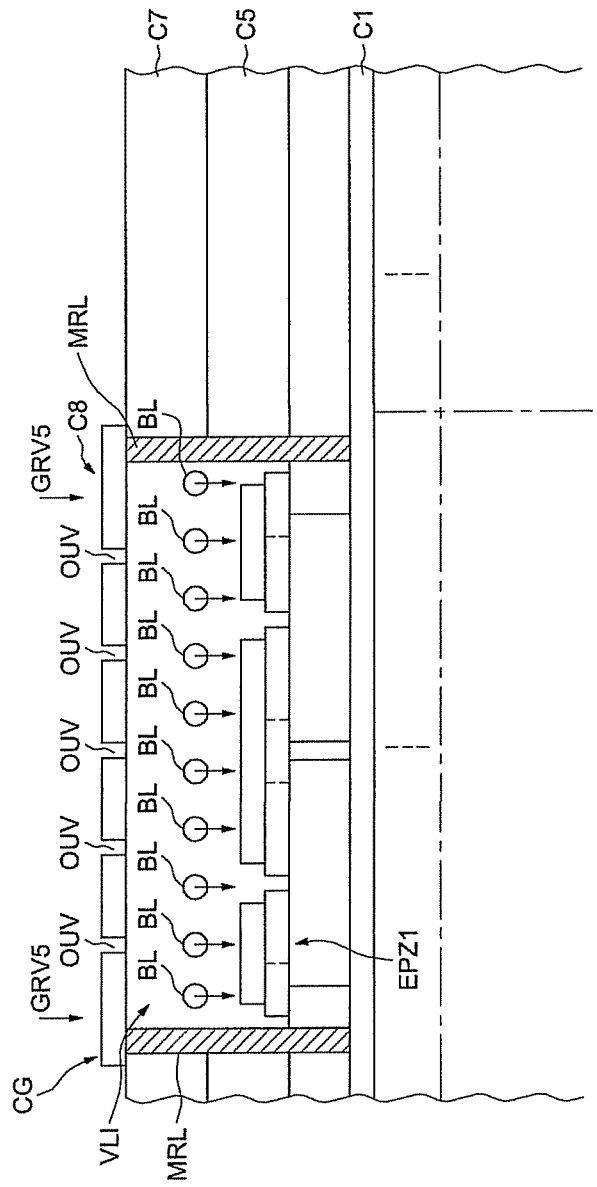
Figure 15:
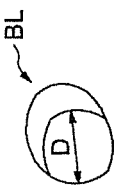

Next, as illustrated in FIG. 14, a plasma etching GRV5 is carried out through the openings OUV so as to eliminate the remnant of the layers C7 and C5 surrounding the objects OB6. The final potatoid-shaped objects BL, which are totally free and which consequently at this juncture of the method fall to the bottom of the cage CG onto the piezoelectric elements EPZ1, are therefore formed by this etching.

But, of course, as soon as there is a relative motion between the cage and the objects BL, the latter may be able to move freely in the interior free volume VLI of the cage CG which is delimited in its upper part by the apertured plate C8. In this regard, the size of the openings OUV, as well as the size of the spaces ESP between the piezoelectric elements, is chosen in such a way that the objects cannot, on the one hand, escape from the cage CG through the upper part, nor fall into the cavities made under the cantilever beams.

By way of indication, if D designates the diameter of a sphere BL, or more exactly of a potatoid, the size of the openings as well as the size of the spaces may be less than D/2. Thus, for a 90-nanometer technology, if a size D of balls BL of the order of 0.6 microns is chosen, openings OUV and spaces ESP of a size ranging from 0.2 to 0.3 microns may be taken.

Moreover, if the balls BL are formed of an electrically conducting material, such as tantalum for example, provision is then made to cover the metal tracks running over the piezoelectric elements with an insulating material, for example a silicon nitride or else a silicon nitride-silicon oxide dual layer. This operation may be performed for example before etching the tracks. If on the other hand the balls BL are formed of an electrically insulating material, such as for example silicon nitride, it is not necessary to electrically insulate the metal tracks disposed on the piezoelectric elements.

Figure 16:
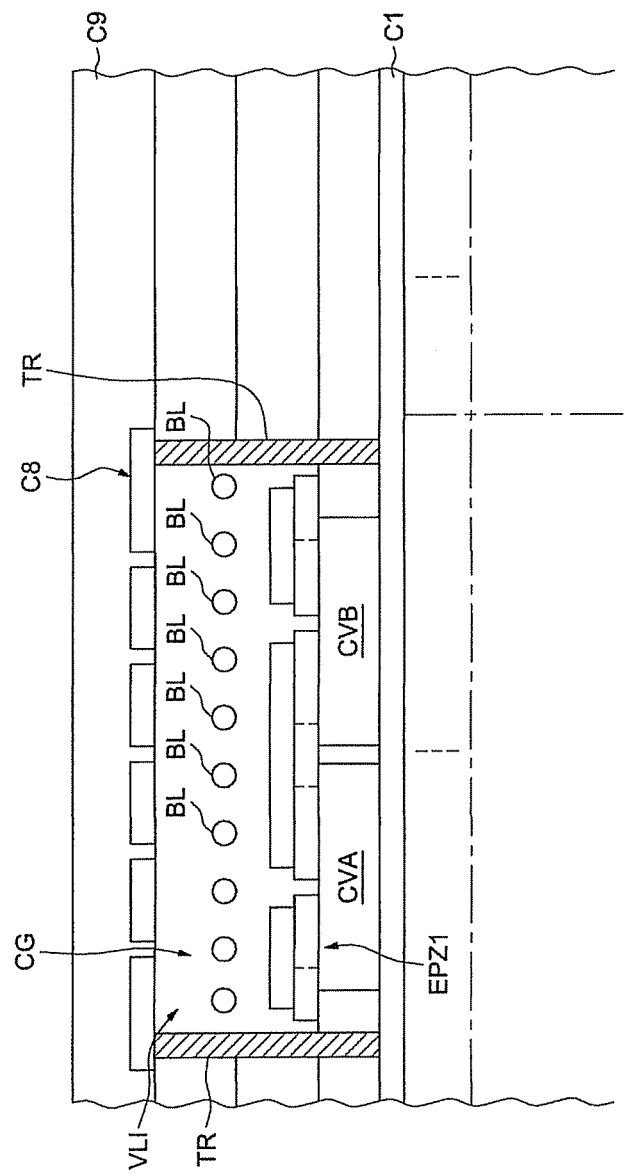

As illustrated in FIG. 16, it is optionally possible to cover the apertured layer C8 with a final layer C9, of for example silicon oxide. It should be noted here that the etching and deposition operations are done under very low pressure, thereby making it possible to maintain a very low pressure in the cage CG, thereby favoring the motion of the objects BL inside the cage. That said, the device would operate even if air at atmospheric pressure were contained in the cage.

It is also possible as a variant to equip the cage with another piezoelectric element at the level of its upper wall. This may now be described with reference to FIGS. 17 and 18. In fact, this variant is readily achievable by replacing the apertured silicon nitride layer C8 of FIG. 14 with a layer of a piezoelectric material, for example the same material as that used for the elements EPZ1, surmounted by etched metal tracks (not represented here for the sake of simplification). The etching of the layers disposed inside the cage is then carried out in the same way through the openings of the apertured piezoelectric layer C80 (FIG. 17).

Next, an auxiliary layer C90, for example silicon nitride, is deposited on the apertured piezoelectric layer C80. After masking, this layer C90 is partially etched so as to form a CVT cavity above the central part of the apertured piezoelectric layer C80. After this etching operation, the piezoelectric layer C80 is maintained on its edges by the remnant of layer C90 and therefore forms a flexible layer that can flex in a direction orthogonal to its plane, and this may happen during impacts with the balls BL.

Figure 17:
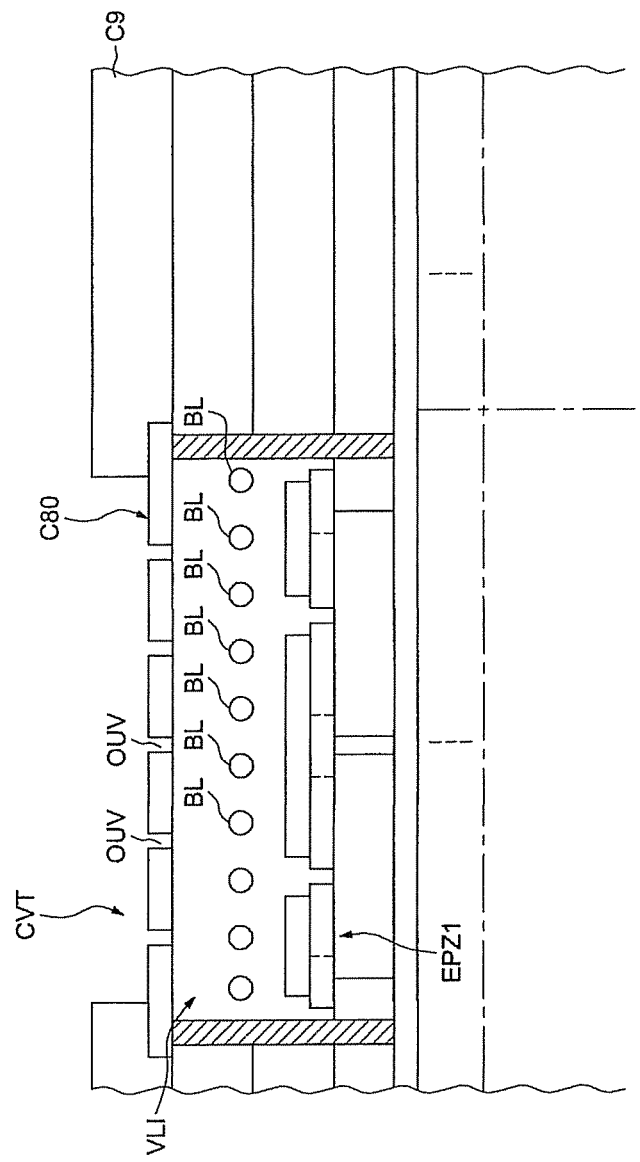
Figure 18:
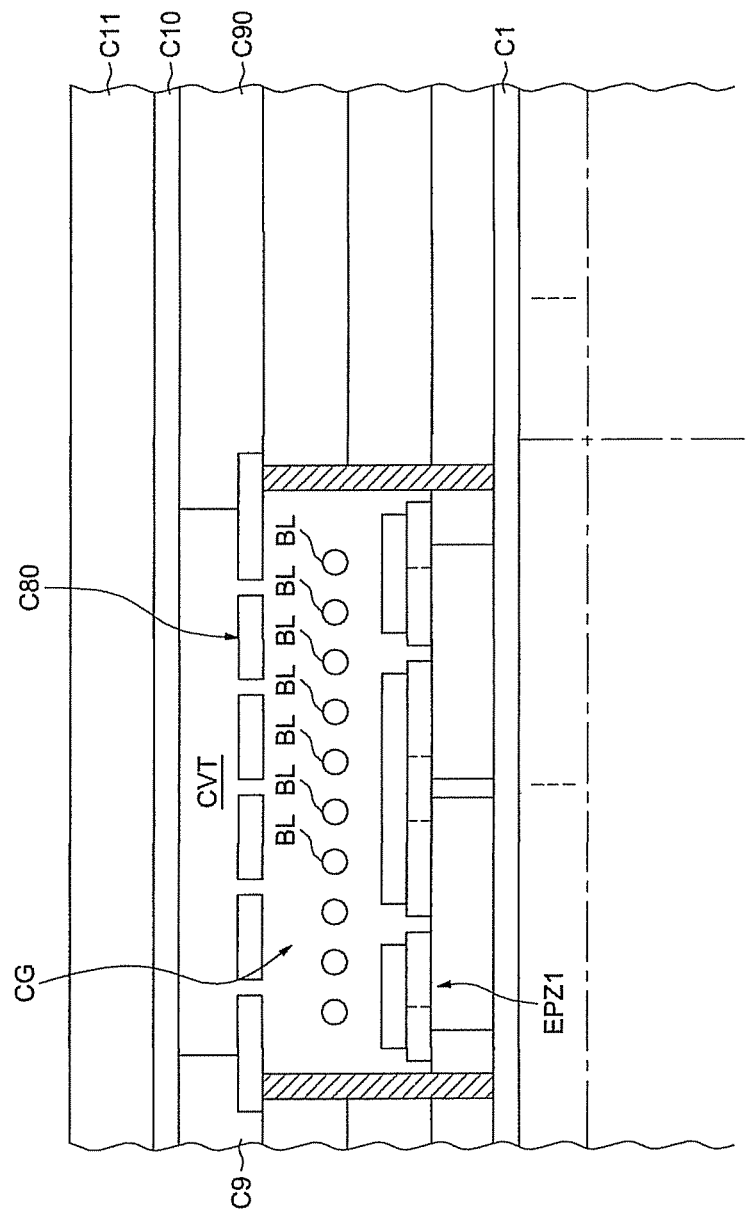

The layer C90 as well as the CVT cavity are thereafter covered by a final covering layer C10, which can be for example at another metallization level of the integrated circuit (FIG. 17). This layer C10 can also be covered subsequently with another layer of dielectric C11. On the basis of the configuration illustrated in FIG. 16 or of that illustrated in FIG. 18, the end of the fabrication of the integrated circuit normally continues in a conventional manner by the optional making of other metallization levels and the formation of contact pads on the upper surface of the integrated circuit.

Figure 19:
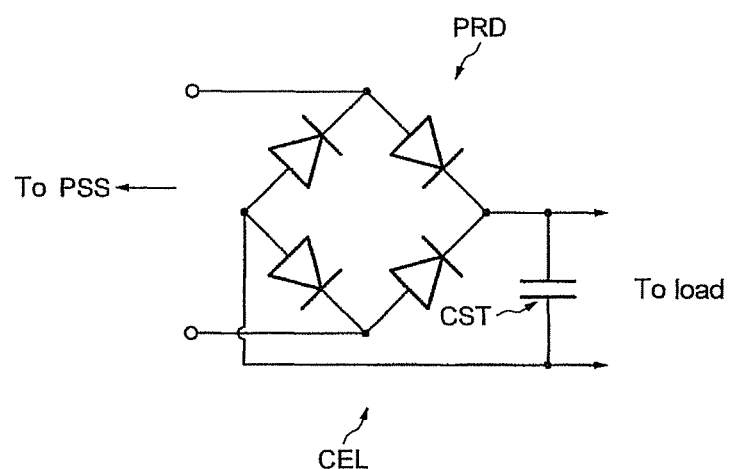
FIG. 19 is a schematic circuit diagram of an embodiment of an energy storage device of the integrated circuit, according to the present embodiment.

FIG. 19 illustrates in a schematic manner an electrical scheme of a circuit CEL making it possible here to store the energy produced in the course of each impact of an object on a piezoelectric element. More precisely, in the example described here, which is wholly non-limiting, the circuit CEL comprises a rectifier bridge PRD based on diodes whose two inputs are coupled to the output PSS of the various piezoelectric elements. The output of the rectifier bridge is connected to the two terminals of a storage capacitor CST that may be able optionally to return the stored energy to a load of the integrated circuit. It is possible to provide a single CEL connected to the assembly to the assembly of the piezoelectric elements or else several circuits CEL, all respectively connected to one or to several piezoelectric elements.

Figure 20:
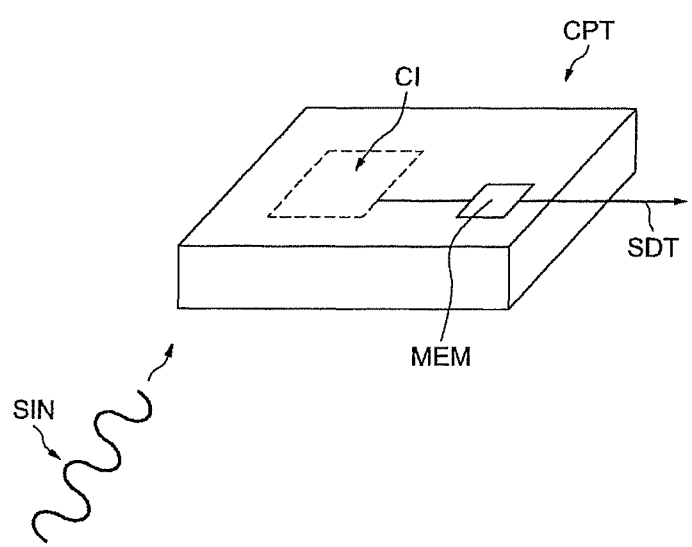
FIG. 20 is a schematic diagram illustrating a sensor incorporating the integrated circuit, according to the present embodiment.
Figure 21:
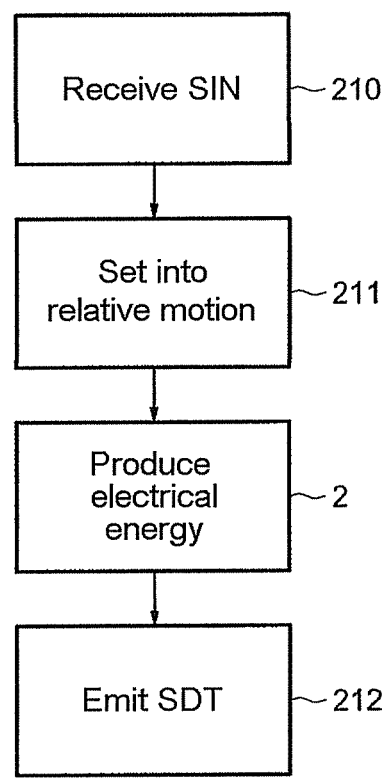
FIG. 21 is a flowchart illustrating operation of the sensor of FIG. 20.

FIG. 20 illustrates by way of nonlimiting example a particular application of the invention comprising incorporating the integrated circuit CI into a sensor CPT. This sensor can be placed on a support intended to be moving or else receive a signal, such as a vibration, SIN emitted remotely upon the occurrence of an event, for example the fracturing of a glass pane on which the sensor CPT is placed. In response to the motion of the support on which the sensor CPT is optionally placed, or to the reception of the vibratory signal SIN (step 210, FIG. 21) there is a setting into relative motion of the cages and of the balls (step 211), the consequence of which is the production of electrical energy 2 described in FIG. 2. This electrical energy can be used to generate the emission of a detection signal SDT (step 212) for example an infrared signal or a radio frequency signal, by way of a conventional emission circuit MEM.

That which is claimed is:

1. A method of generating electrical energy in an integrated circuit, the method comprising:
    setting into relative motion at least one enclosed space in the integrated circuit and at least one free moving object housed in the at least one enclosed space, the integrated circuit comprising at least one piezoelectric element within the at least one enclosed space, the integrated circuit comprising a plurality of layers defining the at least one enclosed space within the plurality of layers;
    producing the electrical energy from impact between the at least one free moving object and the at least one piezoelectric element during the relative motion; and
    transmitting the electrical energy via a plurality of conductive traces in the integrated circuit.

2. The method according to claim 1 wherein the at least one free moving object comprises a plurality thereof in the at least one enclosed space; and wherein the electrical energy production results from the impacts of the plurality of free moving objects on the at least one piezoelectric element in the at least one enclosed space.

3. The method according to claim 1 wherein the at least one piezoelectric element comprises a plurality thereof in the at least one enclosed space; and wherein the electrical energy production results from each impact of the at least one free moving object on the plurality of piezoelectric elements in the at least one enclosed space.

4. The method according to claim 1 wherein the plurality of layers defines a plurality of walls of the at least one enclosed space; wherein the at least one piezoelectric element is adjacent at least one part of at least one wall defining the at least one enclosed space; and wherein the at least one free moving object moves between the at least one piezoelectric element and the other walls defining the at least one enclosed space.

5. The method according to claim 3 wherein the plurality of layers defines first and second walls of the at least one enclosed space; wherein the plurality of piezoelectric elements comprises a first piezoelectric element adjacent a part of the first wall defining the at least one enclosed space, and a second piezoelectric element adjacent a part of the second wall defining the at least one enclosed space; and wherein the at least one free moving object moves between the first piezoelectric element, the second piezoelectric element, and the other walls defining the at least one enclosed space.

6. The method according to claim 2 wherein the plurality of free moving objects comprises identical shaped objects.

7. The method according to claim 2 wherein the plurality of free moving objects comprises different shaped objects.

8. The method according to claim 1 wherein the at least one enclosed space is made above a metallization level of the integrated circuit.

9. The method according to claim 1 wherein the electrical energy produced is stored in a storage device in the integrated circuit.

10. The method according to claim 1 wherein the setting into relative motion results from an occurrence of an event external to the integrated circuit interacting therewith.

11. The method according to claim 10 further comprising:
    detecting the occurrence of the event external to the integrated circuit, the setting into relative motion being caused by an action resulting from the occurrence; and
    emitting a signal generated using the produced electrical energy.

12. An integrated circuit comprising:
    a plurality of layers defining at least one enclosed space including at least one piezoelectric element, the at least one enclosed space being within the plurality of layers; and
    at least one free moving object in said at least one enclosed space; and
    a plurality of electrically conductive traces on said plurality of layers being coupled to said at least one piezoelectric element and configured to provide electrical energy resulting from impact between said at least one free moving object and said at least one piezoelectric element during relative motion of said at least one free moving object and of said at least one enclosed space.

13. The integrated circuit according to claim 12 wherein said at least one free moving object comprises a plurality thereof in relative motion in said at least one enclosed space.

14. The integrated circuit according to claim 12 wherein said at least one piezoelectric element comprises a plurality thereof in said at least one enclosed space.

15. The integrated circuit according to claim 12 wherein the plurality of layers defines a first wall of the at least one enclosed space; wherein said at least one piezoelectric element is adjacent a part of the first wall defining said at least one enclosed space; and wherein said at least one free moving object moves between said at least one piezoelectric element and the other walls defining said at least one enclosed space.

16. The integrated circuit according to claim 14 wherein the plurality of layers defines first and second walls of the at least one enclosed space; wherein said plurality of piezoelectric elements comprises a first piezoelectric element adjacent a part of the first wall defining said at least one enclosed space, and a second piezoelectric element adjacent a part of the second wall defining said at least one enclosed space; and wherein said at least one free moving object moves between said first piezoelectric element, said second piezoelectric element, and the other walls defining said at least one enclosed space.

17. The integrated circuit according to claim 15 wherein said at least one piezoelectric element comprises at least one cantilever beam.

18. The integrated circuit according to claim 12 wherein said at least one piezoelectric element is a monoblock assembly comprising a plurality of cantilever beams.

19. The integrated circuit according to claim 17 wherein the at least one cantilever beam is mounted at a distance from the first wall to form an apertured piezoelectric mat disposed facing the first wall, the apertured spaces of the apertured piezoelectric mat having a smaller size than a size of said at least one free moving object.

20. The integrated circuit according to claim 12 wherein said at least one piezoelectric element comprises an apertured plate with edges fixed to said at least one enclosed space for orthogonal deformation, the plate being formed of at least one piezoelectric material; and wherein the aperture of said apertured plate having a size less than a size of said at least one free moving object.

21. The integrated circuit according to claim 20 further comprising an apertured mat of beams, said apertured plate being disposed facing said apertured mat of beams; and wherein said at least one free moving object moves between said apertured mat of beams and said apertured plate.

22. The integrated circuit according to claim 12 wherein said at least one free moving object comprises a plurality of differently shaped objects.

23. The integrated circuit according to claim 12 wherein said at least one free moving object comprises a plurality of same shaped objects.

24. The integrated circuit according to claim 12 wherein said at least one free moving object is oval-shaped.

25. The integrated circuit according to claim 12 further comprising a metallization layer, said at least one enclosed space being above said metallization level.

26. The integrated circuit according to claim 12 further comprising a storage device coupled to said electrically conductive output and configured to store the electrical energy produced.

27. The integrated circuit according to claim 12 further comprising an emitter configured to deliver an output signal generated based upon the electrical energy provided to said electrically conductive output for indicating detection of an occurrence of an event.

* * * * *